United States Patent
Cho et al.

(10) Patent No.: US 10,096,739 B2
(45) Date of Patent: Oct. 9, 2018

(54) METHOD FOR MANUFACTURING LIGHT ABSORPTION LAYER OF THIN FILM SOLAR CELL AND THIN FILM SOLAR CELL USING THE SAME

(71) Applicant: KOREA INSTITUTE OF ENERGY RESEARCH, Daejeon (KR)

(72) Inventors: Ara Cho, Daejeon (KR); Kyung Hoon Yoon, Daejeon (KR); Se Jin Ahn, Daejeon (KR); Jae Ho Yun, Daejeon (KR); Jihye Gwak, Daejeon (KR); Kee Shik Shin, Daejeon (KR); Young Joo Eo, Daejeon (KR); Seoung Kyu Ahn, Daejeon (KR); Jun Sik Cho, Daejeon (KR); Jin Su You, Seoul (KR); Joo Hyung Park, Daejeon (KR); Ki Hwan Kim, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 0 days.

(21) Appl. No.: 14/782,773

(22) PCT Filed: Dec. 18, 2014

(86) PCT No.: PCT/KR2014/012549
§ 371 (c)(1),
(2) Date: Oct. 6, 2015

(87) PCT Pub. No.: WO2015/160069
PCT Pub. Date: Oct. 22, 2015

(65) Prior Publication Data
US 2017/0033258 A1  Feb. 2, 2017

(30) Foreign Application Priority Data
Apr. 14, 2014  (KR) .......................... 10-2014-0044484

(51) Int. Cl.
*H01L 31/04*  (2014.01)
*H01L 31/20*  (2006.01)
*H01L 31/032* (2006.01)

(52) U.S. Cl.
CPC .......... *H01L 31/208* (2013.01); *H01L 31/032* (2013.01); *H01L 31/04* (2013.01); *Y02E 10/52* (2013.01)

(58) Field of Classification Search
None
See application file for complete search history.

(56) References Cited

U.S. PATENT DOCUMENTS 6,093,996 A      5/2000  Takada et al.
2004/0103936 A1*  6/2004  Andriessen ......... H01L 31/0352
                                                136/252

(Continued)

FOREIGN PATENT DOCUMENTS

EP    1684362 A2      7/2006
JP    2009-004773 A   1/2009

(Continued)

OTHER PUBLICATIONS

Y. Rodriguez-Lazcano et al., CuSbS2 thin film formed through annealing chemically deposited Sb2S3-CuS thin films, 2001, Journal of crystal growth 223 (2001) 399-406.*

(Continued)

*Primary Examiner* — Charles Garber
*Assistant Examiner* — Xiaoming Liu
(74) *Attorney, Agent, or Firm* — Knobbe, Martens, Olson & Bear, LLP (57) ABSTRACT

A method for manufacturing a light absorption layer of a thin film solar cell in in a method for manufacturing a solar cell transparent electrode may be provided that includes: manufacturing a Ib group element-VIa group element binary (Continued)

system nano particle (s100); manufacturing a binary system nano particle slurry of the Ib group element-VIa group element by adding a solvent, binder and a solution precursor including Va group element to the Ib group element-VIa group element binary system nano particle (s200); distributing and mixing the binary system nano particle slurry of the Ib group element-VIa group element (s300); coating the binary system nano particle slurry of the Ib group element-VIa group element on the rear electrode layer 200 (s400); and performing a heat treatment process on the coated nano particle slurry by supplying the VIa group element (s500).

22 Claims, 3 Drawing Sheets

(56) References Cited

U.S. PATENT DOCUMENTS

| | | |
|---|---|---|
| 2007/0012353 A1 | 1/2007 | Fischer |
| 2008/0157235 A1 | 7/2008 | Rogers et al. |
| 2009/0111206 A1 | 4/2009 | Luch |
| 2010/0282288 A1 | 11/2010 | Cornfield |
| 2011/0000541 A1 | 1/2011 | Brendel et al. |
| 2011/0027940 A1 | 2/2011 | Oladeji |
| 2012/0104324 A1* | 5/2012 | Van Duren ......... C23C 18/1204 252/501.1 |
| 2012/0318357 A1* | 12/2012 | Fujdala ............... H01L 31/0256 136/262 |
| 2014/0147961 A1 | 5/2014 | Mitzi et al. |
| 2014/0262810 A1* | 9/2014 | Rondinone ............... C25B 1/00 205/478 |
| 2016/0099366 A1 | 4/2016 | Joo et al. |

FOREIGN PATENT DOCUMENTS

| | | |
|---|---|---|
| KR | 1011480310000 | 5/2012 |
| KR | 1020130011328 | 1/2013 |
| KR | 1020140105635 | 9/2014 |
| KR | 1015948410000 | 2/2016 |
| WO | WO 2014/045335 A1 | 3/2014 |

OTHER PUBLICATIONS

Van Embden et al., "Near-Infrared Absorbing cu12Sb4S13 and Cu3SbS4 Nanocrystals: Synthesis, Characterization, and Photoelectrochemistry", J. Am. Chem. Soc., 2013, vol. 135, pp. 11562-11571, Jul. 23, 2013; 11 pgs.

Dufton et al., "Structural and electronic properties of CuSbS2 and CuBiS2 : potential absorber materials for thin-film solar cells", Phys. Chem. Chem. Phys., 2012, vol. 14, pp. 7229-7233, Apr. 18, 2012; 6 pgs.

Septina et al., "Thin film solar cell based on CuSbS2 absorber fabricated from an electrochemically deposited metal stack", Thin Solid Films, Nov. 2013, vol. 550, pp. 700-704; 6 pgs.

International Search Report dated Mar. 6, 2015 for PCT/KR2014/012549 in 3 pages.

* cited by examiner

METHOD FOR MANUFACTURING LIGHT ABSORPTION LAYER OF THIN FILM SOLAR CELL AND THIN FILM SOLAR CELL USING THE SAME

INCORPORATION BY REFERENCE TO ANY PRIORITY APPLICATIONS

This application is the U.S. National Phase of International Application No. PCT/KR2014/012549, filed Dec. 18, 2014, designating the U.S., which claims the benefit of Korean Patent Application No. 10-2014-0044484, filed Apr. 14, 2014. Any and all applications for which a foreign or domestic priority claim is identified here or in the Application Data Sheet as filed with the present application are hereby incorporated by reference under 37 CFR 1.57.

TECHNICAL FIELD

The present invention relates to a thin film solar cell, and more particularly to a method for manufacturing a thin film having a light absorption layer including a Ib group element, a VIa group element, and a Va group element and a thin film solar cell using the same.

BACKGROUND ART

A solar cell and a power generation system are a technology for directly converting solar energy into electrical energy and receive sunlight and then immediately generate electricity by using the solar cell made up of a semiconductor, dye, polymer, etc. Compared with this, a solar power generation is provided which absorbs the radiant energy of the sun and converts into thermal energy.

Photovoltaic (PV) power generation changes directly unlimited, non-polluting solar energy into electrical energy, and is comprised of a solar cell (module), PCS, power storage device, etc. The most common silicon solar cell is manufactured by joining a p-type semiconductor and an n-type semiconductor (p-n junction) and by coating a transparent conductive film and a metal electrode on both ends of the p-n junction semiconductor. When sunlight is incident on and absorbed into the inside of the semiconductor, electrons and electron holes are generated and are pulled into an electric field by p-n junction. Then, the electrons move to the n-side and the electron holes move to the p-side, and thus, current flows through an external circuit. A photovoltaic system is comprised of a part (module) which receives light and converts the light into electricity and a part (PCS) which converts the generated electricity into alternating current to meet the demand and connects the alternating current to a system.

The core part of the parts constituting the photovoltaic System is a solar cell. The solar cell performs a basic semiconductor device technology, that is, a function of converting sunlight into electrical energy. The solar cell has the same basic structure and the same material characteristics as those of an information display device like laser, a light emitting diode (LED), etc., which convert electricity into light, and just has a reverse operation direction to that of the information display device.

The minimum unit of the solar cell is referred to as a cell. Generally, since one cell outputs a very low voltage, i.e., about 0.5 V, it is necessary to obtain a voltage and output in a practical range in accordance with a range of use by a plurality of solar cells in series or in parallel. Here, for this, a power generator manufactured by being packaged in one piece is referred to as a photovoltaic (PV) module.

The photovoltaic module is manufactured in the form of a panel by using glass, a buffer material, a surface material, etc., in order to protect the solar cell from external environments. The photovoltaic module includes an external terminal which has durability and weather resistance and is used to extract the power. A power generator configured in conformity with a use range by electrically connecting a plurality of photovoltaic modules in series or in parallel through use of a rack and a support in consideration of an installation condition such as an inclination angle, azimuth angle, etc., such that more sunlight can be incident on the plurality of photovoltaic modules is referred to as a photovoltaic (PV) array.

A power conditioning system (PCS) for photovoltaic power generation refers to an inverter which converts direct current (DC) power generated from the photovoltaic array into alternating current (AC) power. The inverter converts direct current (DC) power generated from the photovoltaic array into alternating current (AC) power having a voltage and frequency like a commercial system. Therefore, the PCS is referred to as the inverter. The PCS is composed of an inverter, a power controller, and a protector. The PCS is the largest part among the peripheral devices other than the main body of the solar cell.

Figure 1:
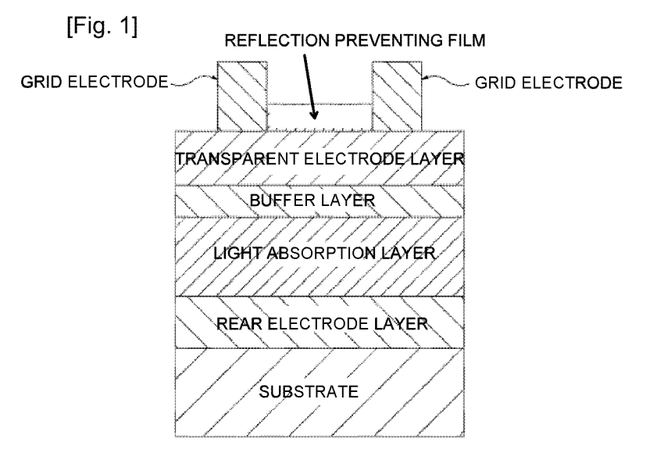
FIG. 1 is a cross-sectional view showing a main part of a conventional thin film solar cell.

The thin film solar cell requires much less amount of a raw material used than that of a crystalline silicon solar cell, has a larger area and can be mass-produced. Therefore, the manufacturing cost of the thin film solar cell can be reduced. Also, the thin film solar cell has a light absorption layer of which the thickness is several $\mu m$, and thus, consumes a very small amount of the raw material. The fifth generation class large area module can be manufactured. The solar cell and the module are manufactured together, so that a simple value chain is obtained. Also, as shown in FIG. 1, a thin film solar cell (module) using a silicon thin film and a compound thin film like CI(G)S and CdTe, etc., is being commercialized.

ACTS thin film or CIGS thin film is a kind of a compound semiconductor and has the highest conversion efficiency (20.3%) among the thin film solar cells manufactured experimentally. Particularly, the CIS thin film or CIGS thin film can be manufactured to have a thickness 10 microns or less and is stable even when used for a long time, so that it is now increasingly taking the place of silicon.

In particular, the CIS thin film is a direct transition semiconductor and can be thinner. The CIS thin film has a band gap of 1.04 eV and is suitable for optical conversion. The CIS thin film has a large light absorption coefficient among known solar cell materials. The CIGS thin film has been developed by replacing a portion of In with Ga or replacing S with Se in order to improve a low open circuit voltage of the CIS thin film.

A CIGS-based solar cell is manufactured by using a thin film having a thickness of several microns. The manufacturing method thereof includes a method using deposition in vacuum and a method applying a precursor material and performing a heat treatment process in non-vacuum. The method using deposition in vacuum is capable of manufacturing an absorption layer with high efficiency. However, when a large area absorption layer is manufactured, it has a low uniformity, has to use a high-priced equipment, and has a high manufacturing cost due to the loss of 20 to 50% of the material to be used. Meanwhile, the method applying a precursor material and performing a high temperature heat treatment process is able to reduce the process cost and uniformly manufacture the large area, however, has a relatively low efficiency of the absorption layer.

The CIGS thin film manufactured by applying the precursor material in non-vacuum has a lot of pores and is not dense. Therefore, a selenization heat treatment process is performed. Since a conventional selenization heat treatment process uses toxic hydrogen selenide ($H_2Se$), a very high cost of equipment is required so as to provide safety equipment and a long term heat treatment process is required, so that the manufacturing cost of the CIGS thin film is high. Also, a melting point of the CIGS thin film is very high over 1,000° C. Therefore, in even CIGS compound nano particles having a size of several tens of nanometers, it is not easy to obtain grain growth and densification due to a post heat treatment.

Due to the above problem, there is a requirement for the material of the light absorption layer other than the CIGS.

Japanese Patent Application Laid-open No. 2009-004773 discloses a solid photovoltaic device including a form of MxSbySz (M=Ag or Cu). Japanese Patent Application Laid-open No. 2009-004773 discloses the solid photovoltaic device which has an interpenetration structure in which three all solid inorganic components (two transparent n-type semiconductors and transparent p-type semiconductors, and one absorber) which maintain a sufficient photovoltaic performance at a low cost is used as a base. The solid photovoltaic device includes three inorganic solid materials including a composition of at least one absorber compound which exists as a continuous layer between a transparent n-type semiconductor compound and a transparent p-type semiconductor compound and does not contact the transparent n-type semiconductor compound and the transparent p-type semiconductor compound. One side of the transparent n-type semiconductor compound or the transparent p-type semiconductor compound exists as a porous substrate having a plurality of pores. The inner surfaces of the plurality of pores are wholly covered with the thin and continuous absorption layer of the absorber compound, so that the plurality of pores are filled at a volume ratio greater than at least 10% thereof with a cover layer made of the one side of the transparent p-type semiconductor compound or the transparent n-type semiconductor compound. The absorption layer includes at least one compound based on antimony and silver sulfide or one compound based on antimony and copper sulfide. However, the solid photovoltaic device disclosed in Japanese Patent Application Laid-open No. 2009-004773 has a fuel sensitizing type structure and is different from a below-described thin films solar cell according to an embodiment of the present invention.

SUMMARY

The CIGS applied to the light absorption layer of the thin-film solar cell has a high material cost. Also, since a selenization process uses toxic hydrogen selenide ($H_2Se$), a very high cost of equipment is required so as to provide safety equipment and a long term heat treatment process is required, so that the manufacturing cost of the CIGS thin film is increased. For the above reason, the process is not easy to perform in non-vacuum.

Also, a melting point of the CIGS thin film is very high over 1,000° C. Therefore, in even CIGS compound nano particles having a size of several tens of nanometers, it is not easy to obtain grain growth and densification due to a post heat treatment. Particularly, regarding amorphous growth, the thin film is short-circuited.

To solve the above problems, in a method for manufacturing a solar cell transparent electrode, the present invention provides a method for manufacturing a light absorption layer of a thin film solar cell including: a substrate 100; a rear electrode layer 200 which is formed on the substrate; a light absorption layer 300 which is formed on the rear electrode layer 200; a buffer layer 400 which is formed on the light absorption layer; and a transparent electrode layer 500 which is formed on the buffer layer 400. The method includes: manufacturing a Ib group element-VIa group element binary system nano particle (s100); manufacturing a binary system nano particle slurry of the Ib group element-VIa group element by adding a solvent, binder and a solution precursor including Va group element to the Ib group element-VIa group element binary system nano particle (s200); distributing and mixing the binary system nano particle slurry of the Ib group element-VIa group element (s300); coating the binary system nano particle slurry of the Ib group element-VIa group element on the rear electrode layer 200 (s400); and performing a heat treatment process on the coated nano particle slurry by supplying the VIa group element (s500).

According to the embodiment of the present invention, the thin film solar cell having a light absorption layer including a Ib group element, a VIa group element, and a Va group element has a manufacturing cost less than that of a solar cell which uses CIGS as a light absorption layer. When sulfur is used as a Va group element, the heat treatment process uses S powder instead of hydrogen selenide ($H_2Se$), so that safety during the process can be obtained.

The present invention provides a precursor based on a hybrid type in which a binary system nano particle is first manufactured and then slurry is manufactured by adding a solution precursor to binary system nano particle. Before being applied on the rear electrode layer, the binary system nano particle slurry can easily change a mixing ratio of Ib group element-VIa group element and Va group element of the solution precursor, and causes the Ib group element-VIa group element to react with the Va group element in a post heat treatment, thereby more easily applying a Ib group element-VIa group element-Va group element compound having a desired ratio. Particularly, the above-mentioned binary system nano particle slurry can be applied to even a case where the Ib group element-VIa group element-Va group element compound cannot be synthesized at a time.

Also, $CuSbS_2$ as an embodiment of the Ib group element, VIa group element, and Va group element has the smallest band gap of 1.4. Since the band gap is larger than that of the CIGS, the $CuSbS_2$ can be applied to a tandem solar cell.

Also, unlike the CIGS thin film which is short-circuited when the CIGS compound nano particles grow amorphously, a thin film having an improved density without being short-circuited by the amorphous growth can be obtained by applying $CuSbS_2$.

DETAILED DESCRIPTION OF CERTAIN EMBODIMENTS

Figure 2:
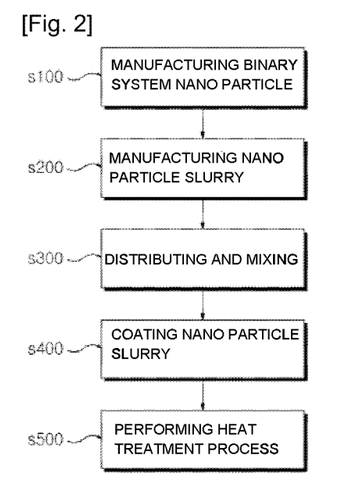
FIG. 2 is a flowchart of a method for manufacturing a light absorption layer of a thin film solar cell according to an embodiment of the present invention.
Figure 3:
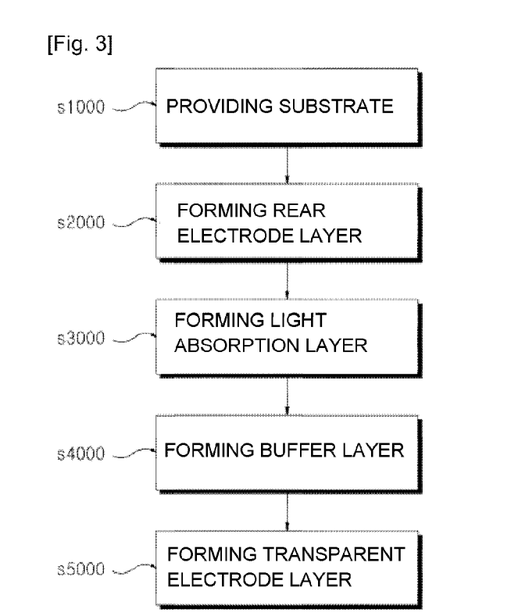
FIG. 3 is a flowchart of a method for manufacturing the thin film solar cell according to the embodiment of the present invention.

The present invention relates to a thin film solar cell, and more particularly to a method for manufacturing a thin film having a light absorption layer including a Ib group element, a VIa group element, and a Va group element and a thin film solar cell using the same. Hereafter, an embodiment of the present invention will be described in detail with reference to the accompanying drawings. FIG. 2 is a flowchart of a method for manufacturing a light absorption layer of a thin film solar cell according to an embodiment of the present invention.

The present invention provides a method for manufacturing the light absorption layer of the thin film solar cell including: a substrate 100; a rear electrode layer 200 which is formed on the substrate; a light absorption layer 300 which is formed on the rear electrode layer 200; a buffer layer 400 which is formed on the light absorption layer; and a transparent electrode layer 500 which is formed on the buffer layer 400. The method includes: manufacturing a Ib group element-VIa group element binary system nano particle (s100); manufacturing a binary system nano particle slurry of the Ib group element-VIa group element by adding a solvent, binder and a solution precursor including Va group element to the Ib group element-VIa group element binary system nano particle (s200); distributing and mixing the binary system nano particle slurry of the Ib group element-VIa group element (s300); coating the binary system nano particle slurry of the Ib group element-VIa group element on the rear electrode layer 200 (s400); and performing a heat treatment process on the coated nano particle slurry by supplying the VIa group element (s500).

In the manufacturing the Ib group element-VIa group element binary system nano particle (s100), the Ib group element may be copper (Cu) or silver (Ag), and the VIa group element may be selected from among sulfur (S), selenium (Se), and tellurium (Te). It is desirable to select sulfur (S) as the VIa group element. As described above, when selenium (Se) is selected, the selenization process according to a post heat treatment process uses toxic hydrogen selenide ($H_2Se$), a very high cost of equipment is required so as to provide safety equipment and a long term heat treatment process is required, so that the manufacturing cost of the CIGS thin film is increased. When sulfur (S) is employed, the post heat treatment process applies and heats S powder, so that sulfurization can be performed in the heat treatment process without separate safety equipment.

In the manufacturing the Ib group element-VIa group element binary system nano particle (s100), the Ib group element-VIa group element binary system nano particle may be manufactured by at least one method selected from the group consisting of a low temperature colloidal method, a solvent thermal method, a microwave method, and an ultrasonic synthesis method.

In the manufacturing a binary system nano particle slurry of the Ib group element-VIa group element by adding a solvent, binder and a solution precursor including Va group element to the Ib group element-VIa group element binary system nano particle (s200), it is desirable that the solvent should be any one selected from the group consisting of ethanol, methoxyethanol, methanol, phentanol, propanol, and butanol. A variety of alcohols may be used as the solvent. The most preferred embodiment is methanol.

Also, in the manufacturing a binary system nano particle slurry of the Ib group element-VIa group element by adding a solvent, binder and a solution precursor including Va group element to the Ib group element-VIa group element binary system nano particle (s200), the Va group element may be selected from among antimony (Sb), phosphorus (P), and arsenic (As). It is desirable to select antimony (Sb) as the Va group element.

When the solution precursor includes antimony (Sb), it is desirable that one selected from the group consisting of antimony acetate, antimony chloride, and a mixture of them is employed as the antimony (Sb).

In the manufacturing a binary system nano particle slurry of the Ib group element-VIa group element by adding a solvent, binder and a solution precursor including Va group element to the Ib group element-VIa group element binary system nano particle (s200), it is desirable that the binder is a chelating agent and the chelating agent is any one selected from the group consisting of monoethanolamine (MEA), diethanolamine (DEA), triethanolamine (TEA), ethylenediamine, EDTA, NTA, HEDTA, GEDTA, TTHA, HIDA and DHEG.

In the manufacturing a binary system nano particle slurry of the Ib group element-VIa group element by adding a solvent, binder and a solution precursor including Va group element to the Ib group element-VIa group element binary system nano particle (s200), it is desirable that a mixing ratio of the Ib group element-VIa group element binary system nano particle:solvent:solution precursor and binder is a weight ratio of 1:2 to 6:1 to 2, and particularly, the most preferred mixing ratio is 3:12:4.

In the distributing and mixing the binary system nano particle slurry of the Ib group element-VIa group element (s300), it is desirable to apply an ultrasonic mixing method irradiating an ultrasonic wave for 30 to 120 minutes.

Before being applied on the rear electrode layer 200, the above binary system nano particle slurry is able to easily change the mixing ratio of the Ib group element-VIa group element and Va group element of the solution precursor, and causes the Ib group element-VIa group element to react with the Va group element in a post heat treatment, thereby more easily applying a Ib group element-VIa group element-Va group element compound having a desired ratio.

In the coating the binary system nano particle slurry of the Ib group element-VIa group element on the rear electrode layer 200 (s400), it is desirable that the coating is performed in non-vacuum. The non-vacuum coating may apply at least one selected from the group consisting of a doctor blade coating, a spin coating, a spray coating, an ultrasonic spraying method, a screen printing method, an inkjet printing method, and a dip coating.

When the doctor blade coating is applied among the above methods, it is desirable that the coating process is performed through the setting of the heights of the substrate and blade to 20 to 150 μm.

In the coating the binary system nano particle slurry of the Ib group element-VIa group element on the rear electrode layer 200 (s400), it is desirable that drying after the coating (s410) is included in s400. The coating (s400) and the drying after the coating (s410) may be repeated several times so as to obtain the thin film having a desired thickness.

In the performing a heat treatment process on the coated nano particle slurry by supplying the VIa group element (s500), sulfur (S) or selenium (Se) may be applied as the VIa group element. It is desirable to apply the sulfur (S) so as to obtain a larger band gap and so as not to use toxic hydrogen selenide ($H_2Se$).

In the performing a heat treatment process (s500), the Ib group element-VIa group element binary system nano particle and the Va group element included in the solution precursor react with each other, so that the Ib group element-VIa group element-Va group element compound is created.

Figure 4:
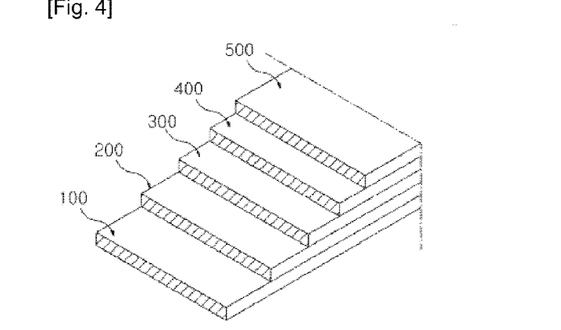
FIG. 4 is a perspective view showing a main part of the thin film solar cell according to the embodiment of the present invention.
Figure 5:
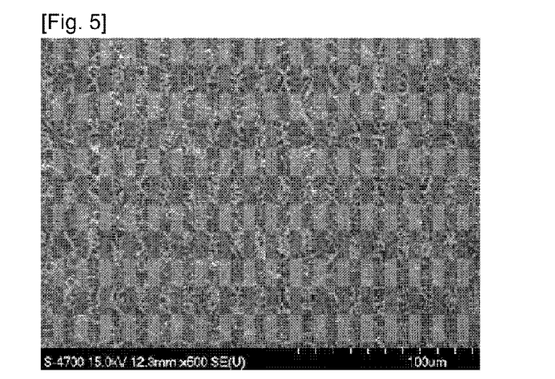
FIG. 5 is a SEM picture showing a thin film obtained by repeatedly coating Cu—S nano particle+Sb precursor hybrid ink four times.

Furthermore, as shown in FIGS. 4 and 5, the present invention provides a method for manufacturing the thin film solar cell including: a substrate 100; a rear electrode layer 200 which is formed on the substrate; a light absorption layer 300 which is formed on the rear electrode layer 200; a buffer layer 400 which is formed on the light absorption layer; and a transparent electrode layer 500 which is formed on the buffer layer 400. The method includes:
providing the substrate 100 (s1000);
forming the rear electrode layer 200 on the substrate (s2000);
forming the light absorption layer 300 on the rear electrode layer 200 (s3000);
forming the buffer layer 400 on the light absorption layer 300 (s4000); and
forming the transparent electrode layer 500 on the buffer layer 400, the transparent electrode layer 500 including any one selected from the group consisting of zinc oxide, gallium oxide, aluminum oxide, indium oxide, lead oxide, copper oxide, titanium oxide, tin oxide, iron oxide, tin dioxide, and indium tin oxide (s5000).

The forming the light absorption layer 300 on the rear electrode layer 200 (s3000) is performed by the described method for manufacturing the light absorption layer of the thin film solar cell according to the embodiment of the present invention.

In the forming the rear electrode layer 200 on the substrate (s2000), the rear electrode layer 200 may be formed to include at least any one selected from the group consisting of molybdenum (Mo), chrome (Cr), and tungsten (W).

Also, in the forming the buffer layer 400 on the light absorption layer 300 (s4000), the buffer layer 400 may be formed to include at least any one selected from the group consisting of CdS, CdZnS, ZnS, Zn(S,O), Zn(OH,S), ZnS(O,OH), ZnSe, ZnInS, ZnInSe, ZnMgO, Zn(Se,OH), ZnSnO, ZnO, InSe, InOH, In(OH,S), In(OOH,S), and In(S,O). The buffer layer using zinc has not high efficiency, has a high cost and has advantages in economic efficiency and safety, compared with a toxic cadmium-based buffer layer.

The buffer layer 400 may be formed by at least any one selected from the group consisting of chemical bath deposition (CBD), electrodeposition, co-evaporation, sputtering, atomic layer epitaxy, atomic layer deposition, chemical vapor deposition (CVD), metal organic chemical vapor deposition (MOCVD), molecular beam epitaxy (MBE), spray pyrolysis, ion layer gas reaction (ILGAR), and pulsed laser deposition.

Meanwhile, in the forming the transparent electrode layer 500 on the buffer layer 400 (s5000), a thin film made of at least any one selected from the group consisting of zinc oxide (ZnO), indium tin oxide (ITO), platinum, gold, gallium oxide, aluminum oxide, lead oxide, copper oxide, titanium oxide, tin oxide, iron oxide, and tin dioxide may be applied as the transparent electrode layer 500. The transparent electrode layer 500 is deposited on the buffer layer 400 by one of RF magnetron sputtering, DC magnetron sputtering, MF magnetron sputtering, thermal evaporation, E-beam evaporation, and thermal spraying.

Hereafter, a preferred embodiment of the present invention will be described in detail.

Embodiment

In the manufacturing the Ib group element-VIa group element binary system nano particle, copper (Cu) is applied as the Ib group element, and sulfur (S) is applied as the VIa group element. The nano particle is manufactured by a low temperature colloidal method. CuI is mixed with distilled pyridine solvent of 30 ml in a glove box, and then is mixed with $Na_2S$ dissolved in distilled methanol of 20 ml. An atomic ratio of copper (Cu):sulfur (S) corresponds to 2:1. The methanol/pyridine mixture is mechanically stirred and reacts for 7 minutes in an ice bath at a temperature of 0° C., so that colloid including Cu—S nano particles is synthesized. The colloid is centrifuged at 10,000 rpm for about 10 minutes and is ultrasonically treated, and then is washed with distilled methanol. By repeating this procedure, a by-product and pyridine in the product are completely removed, so that high-purity Cu—S binary system nano particle is synthesized. Here, a ratio of the binary system nano particle:solvent (methanol) is 1:4.

Next, the 0.2543 g Cu—S binary system nano particle, 0.5508 g antimony acetate of the solution precursor, 0.3406 g monoethanolamine as a chelating agent, and 0.3406 g methanol as a solvent are mixed, and the ultrasonic treatment is performed for 60 minutes, so that $CuSbS_2$ hybrid slurry is manufactured. Here, an atomic ratio is maintained such that Cu—S binary system nano particle:the antimony acetate is 2:1, and the antimony acetate:the chelating agent is 1:6. The methanol is adjusted to the viscosity and added. Subsequently, the manufactured hybrid slurry is ripened for 7 days. The ripened hybrid slurry is coated on a Mo thin film deposited soda lime glass substrate by using the doctor blade coating method. Here, the heights of the substrate and blade are set to 50 μm. After the coating, drying is performed on a hot plate through three steps. Here, the drying is performed at a temperature of 80° C. for 5 minutes in the first step, is performed at a temperature of 120° C. for 5 minutes in the second step, and is performed at a temperature of 200° C. for 5 minutes in the third step. This coating and drying process is repeatedly performed three times, so that a precursor thin film having a predetermined thickness is formed. Lastly, the sulfurization heat treatment is performed with the supply of the sulfur (S) powder at the substrate temperature of 500° C., so that a $CuSbS_2$ thin film is manufactured.

Figure 6:
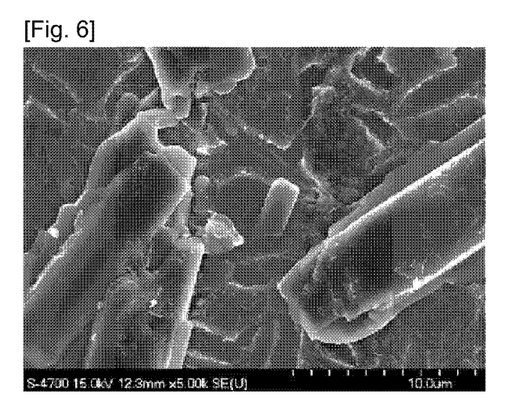
FIG. 6 is a SEM picture showing a thin film obtained by supplying S powder at a temperature of 500° C. and performing a sulfuration heat treatment.

In the embodiment, a SEM picture of the thin film as shown in FIG. 5 is obtained. When the S powder is supplied at a temperature of 500° C. and the sulfurization heat treatment is performed as shown in FIG. 6, a thin film having an improved density without being short-circuited by the amorphous growth can be obtained. The photovoltaic conversion efficiency by the $CuSbS_2$ is about 2.5%.

That is, according to the embodiment of the present invention, the thin film solar cell having the light absorption layer including the Ib group element, the VIa group element, and the Va group element has a manufacturing cost less than that of a solar cell which uses the CIGS as a light absorption layer. When sulfur is used as a Va group element, the heat treatment process uses S powder instead of hydrogen selenide ($H_2Se$), so that safety during the process can be obtained. The $CuSbS_2$ to which the Ib group element, the VIa group element, and the Va group element have been applied has the smallest band gap of 1.4. Since the band gap is larger than that of the CIGS, the $CuSbS_2$ can be applied to a tandem solar cell.

The present invention has been described with reference to the accompanying drawings. This is just one of various embodiments including the subject matter of the present invention and intends to allow those skilled in the art to easily embody the present invention. It is clear that the present invention is not limited to the above-described embodiments. Therefore, the scope of the present invention should be construed by the following claims. Without departing from the subject matter of the present invention, all the technical spirits within the scope equivalent to the subject matter of the present invention is included in the right scope of the present invention by the modifications, substitutions, changes and the like. Also, it is clear that some of the drawing configuration are intended for more clearly describing the configuration and are more exaggerated or shortened than the actual one.

What is claimed is:

1. A method for manufacturing a light absorption layer of a thin film solar cell, the method comprising
    i) manufacturing Ib group element-VIa group element binary system nano particles;
    ii) adding a solvent, a binder and a solution precursor comprising a Va group element to the Ib group element-VIa group element binary system nano particles to form a slurry, wherein the mixing ratio by weight of the Ib group element-VIa group element binary system nano particles: the solvent: the solution precursor and the binder is 1:2 to 6:1 to 2;
    iii) mixing the binary system nano particle slurry of the Ib group element-VIa group element;
    iv) coating the binary system nano particle slurry of the Ib group element-VIa group element on a rear electrode layer of the solar cell; and
    v) performing a heat treatment process on the coated nano particle slurry while supplying the VIa group element.

2. The method of claim 1, wherein in the manufacturing the Ib group element-VIa group element binary system nano particles, the Ib group element is copper (Cu) or silver (Ag), and the VIa group element is at least one selected from the group consisting of sulfur (S), selenium (Se), and tellurium (Te).

3. The method of claim 1, wherein in the manufacturing the Ib group element-VIa group element binary system nano particles, the Ib group element-VIa group element binary system nano particles are manufactured by at least one method selected from the group consisting of a low temperature colloidal method, a solvent thermal method, a microwave method, and an ultrasonic synthesis method.

4. The method of claim 1, wherein the solvent is selected from the group consisting of ethanol, methoxyethanol, methanol, phentanol, propanol, and butanol.

5. The method of claim 1, wherein the Va group element comprises at least one selected from the group consisting of antimony (Sb), phosphorus (P), and arsenic (As).

6. The method of claim 5, wherein the Va group element comprises antimony (Sb) in a form selected from the group consisting of antimony acetate, antimony chloride, and a mixture thereof.

7. The method of claim 5, wherein the binder is a chelating agent.

8. The method of claim 7, wherein the chelating agent is selected from the group consisting of monoethanolamine (MEA), diethanolamine (DEA), triethanolamine (TEA), ethylenediamine, ethylenediaminetetraacetic acid (EDTA), nitrilotriacetic acid (NTA), hydroxyethylethylenediaminetriacetic acid (HEDTA), glycoletherdiaminetetraacetic acid (GEDTA), triethylenetetraminehexaacetic acid (TTHA), hydroxyethyliminodiacetic acid (HIDA) and dihydroxyethylglycine (DHEG).

9. The method of claim 1, wherein the mixing step comprises applying an ultrasonic wave for 30 to 120 minutes.

10. The method of claim 1, wherein the coating step is not performed under vacuum.

11. The method of claim 10, wherein the coating step comprises at least one selected from the group consisting of: doctor blade coating, spin coating, spray coating, ultrasonic spraying, screen printing, inkjet printing, and dip coating.

12. The method of claim 11, wherein the doctor blade coating is performed by setting heights of a coating substrate and a doctor blade to 20 to 150 μm.

13. The method of claim 1, further comprising drying the rear electrode layer after the coating step.

14. The method of claim 1, wherein, the VIa group element comprises sulfur (S) or selenium (Se).

15. A light absorption layer of a thin film solar cell,
    wherein the light absorption layer is installed in the thin film solar cell and comprises a Ib group element, a VIa group element, and a Va group element; and
    wherein the light absorption layer is manufactured by the manufacturing method of claim 1.

16. A method for manufacturing a thin film solar cell, the method comprising:
    (i) providing a substrate;
    (ii) forming a rear electrode layer on the substrate;
    (iii) forming a light absorption layer on the rear electrode layer;
    (iv) forming a buffer layer on the light absorption layer; and
    (v) forming a transparent electrode layer on the buffer layer, the transparent electrode layer comprising an oxide selected from the group consisting of: zinc oxide, gallium oxide, aluminum oxide, indium oxide, lead oxide, copper oxide, titanium oxide, tin oxide, iron oxide, tin dioxide, and indium tin oxide,
    wherein the forming the light absorption layer on the rear electrode layer is performed by the method of claim 1.

17. The method of claim 16, wherein the rear electrode layer comprises at least any one selected from the group consisting of molybdenum (Mo), chrome (Cr), and tungsten (W).

18. The method of claim 16, wherein, the buffer layer is formed to comprise at least any one selected from the group consisting of: CdS, CdZnS, ZnS, Zn(S,O), Zn(OH,S), ZnS (O,OH), ZnSe, ZnInS, ZnInSe, ZnMgO, Zn(Se,OH), ZnSnO, ZnO, InSe, InOH, In(OH,S), In(OOH,S), and In(S, O).

19. The method of claim 16, wherein the buffer layer is formed by at least any one selected from the group consisting of chemical bath deposition (CBD), electrodeposition, co-evaporation, sputtering, atomic layer epitaxy, atomic layer deposition, chemical vapor deposition (CVD), metal organic chemical vapor deposition (MOCVD), molecular beam epitaxy (MBE), spray pyrolysis, ion layer gas reaction (ILGAR), and pulsed laser deposition.

20. The method of claim 16, wherein, the transparent electrode layer on the buffer layer is formed in a thin film, and the film comprises platinum or gold.

21. The method of claim 16, wherein forming the transparent electrode layer on the buffer layer is accomplished by one selected from the group consisting of: Radio Frequency (RF) magnetron sputtering, Direct Current (DC) magnetron sputtering, Mid-Frequency (MF) magnetron sputtering, thermal evaporation, Electron-beam (E-beam) evaporation, and thermal spraying.

22. A thin film solar cell comprising: a substrate; a rear electrode layer which is formed on the substrate; a light absorption layer which is formed on the rear electrode layer; a buffer layer which is formed on the light absorption layer; and a transparent electrode layer which is formed on the buffer layer, wherein the light absorption layer is manufactured by the manufacturing method of claim 1.

\* \* \* \* \*